(12) United States Patent
Lee et al.

(10) Patent No.: US 7,791,960 B2
(45) Date of Patent: Sep. 7, 2010

(54) SEMICONDUCTOR MEMORY DEVICE AND CONTROL SIGNAL GENERATING METHOD THEREOF

(75) Inventors: Chung-Ki Lee, Seoul (KR); Hyong-Yong Lee, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 230 days.

(21) Appl. No.: 12/049,160

(22) Filed: Mar. 14, 2008

(65) Prior Publication Data

US 2008/0225608 A1   Sep. 18, 2008

(30) Foreign Application Priority Data

Mar. 14, 2007   (KR) ...................... 10-2007-0025013

(51) Int. Cl.
*G11C 7/00* (2006.01)
(52) U.S. Cl. .................. 365/189.09; 365/191; 365/194; 365/225.7
(58) Field of Classification Search ............ 365/189.09, 365/191, 194, 225.7
See application file for complete search history.

(56) References Cited

U.S. PATENT DOCUMENTS

| | | | | |
|---|---|---|---|---|
| 5,336,947 | A * | 8/1994 | Lehning | ....................... 327/18 |
| 2006/0044917 | A1 * | 3/2006 | Kawakami et al. | .......... 365/226 |
| 2006/0132195 | A1 * | 6/2006 | Kim et al. | ................... 327/108 |
| 2006/0132417 | A1 * | 6/2006 | Shigenobu et al. | ............ 345/98 |
| 2007/0024363 | A1 * | 2/2007 | Cho | ....................... 330/124 R |

FOREIGN PATENT DOCUMENTS

| | | | |
|---|---|---|---|
| JP | 409046195 A | * | 2/1997 |
| KR | 10-2006-0002665 | | 1/2006 |
| KR | 10-2006-0031027 | | 4/2006 |
| KR | 10-2006-0099139 | | 9/2006 |
| KR | 10-2006-0112298 | | 10/2006 |

OTHER PUBLICATIONS

English language abstract of Korean Publication No. 10-2006-0002665.
English language abstract of Korean Publication No. 10-2006-0031027.
English language abstract of Korean Publication No. 10-2006-0112298.

* cited by examiner

*Primary Examiner*—Hoai V Ho
(74) *Attorney, Agent, or Firm*—Volentine & Whitt, PLLC

(57) ABSTRACT

A semiconductor memory device and a control signal generating method thereof. The semiconductor memory device may include a voltage range detector configured to generate a voltage detecting signal corresponding to a range of a level of an external power voltage. A control signal generating portion may be used to generate a control signal corresponding to the range of the level of the external power voltage responsive to the voltage detecting signal. As a result, the semiconductor memory device can perform an operation for satisfying an access time characteristic according to a specification responsive to the control signal.

13 Claims, 8 Drawing Sheets

SEMICONDUCTOR MEMORY DEVICE AND CONTROL SIGNAL GENERATING METHOD THEREOF

CROSS-REFERENCE TO RELATED APPLICATION

This application claims the benefit of Korean Patent Application No. 2007-25013, filed Mar. 14, 2007, the disclosure of which is hereby incorporated herein by reference in its entirety.

BACKGROUND OF THE INVENTION

1. Field of the Invention

The present invention relates to a semiconductor memory device and, more particularly, to a semiconductor memory device in which a control signal is used to control an internal operation of the semiconductor memory device, and a control signal generating method thereof.

2. Description of the Related Art

A conventional semiconductor memory device comprises a control signal setting portion. The control signal setting portion sets a control signal responsive to a code signal applied from an external portion. The control signal setting portion receives a code signal applied from an external portion during a mode setting operation and decodes the code signal to set a control signal. The semiconductor memory device varies a delay time or an internal voltage of internal circuits responsive to the control signal. If the internal circuits of the semiconductor device do not operate normally, the semiconductor device can operate normally by setting the control signal to vary the delay time or the internal voltage of the internal circuits.

The conventional semiconductor memory device performs an AC characteristic test and a function test during a test operation. The AC characteristic test is to test a dynamic characteristic such as a signal delay time and an access time, and the function test is to test whether memory cells of a memory cell array of the semiconductor memory device are normal cell or defective cells by writing/reading data to/from the semiconductor memory device. The AC characteristic test and the function test are simultaneously performed. For example, it is tested whether an access time according to a specification (e.g., a time of from when a row address strobe signal RASB is activated until effective output data are outputted to an output terminal of the semiconductor memory device) is satisfied or not by performing the function test of the semiconductor memory device at a varied external power voltage while varying a level of the external power voltage.

FIG. 1A is a graph illustrating evaluation of an operating margin of a conventional semiconductor memory device. In the graph of FIG. 1A, a vertical axis denotes an external power voltage EVDD, a horizontal axis denotes an access time, "P" represents that it is determined as a normal operation by the function test, and "tRAS" represents an access time according to a specification.

As shown in FIG. 1A, the conventional semiconductor memory device operates while satisfying the access time according to the specification with a sufficient margin when the external power voltage is equal to or larger than 1.8 volts, whereas it operates without satisfying the access time according to the specification or without having a sufficient margin even though it satisfies the access time according to the specification when the external power voltage is equal to or less than 1.7 volts.

For example, the semiconductor memory device may normally operate at an external power voltage range of a high (low) level (equal to or larger than 1.8 volts), but does not operate normally at an external power voltage range of a low (high) level (equal to or less than 1.7 volts). To overcome the abnormal operation, the access time is varied by varying a control signal of the control signal setting portion to vary a delay time of the internal circuits, thereby adjusting the delay time so that the semiconductor memory device can operate at the external power voltage range of the high (low) level as well as the external power voltage range of the low (high) level.

However, even though the semiconductor memory device normally operates at the external power voltage range of the low (high) level by varying and setting the control signal of the control signal setting portion, the semiconductor memory device, which has operated normally at the external power voltage range of the high (low) level when the control signal is not set, may not operate normally at the external power voltage range of the high (low) level when the control signal is set.

FIG. 1B is a graph illustrating evaluation of an operating margin of a conventional semiconductor memory device when a control signal set by the control signal setting portion is applied. The semiconductor memory device satisfies the access time according to a specification with a sufficient margin when the external power voltage EVDD is equal to or less than 1.8 volts, whereas it does not satisfy the access time according to a specification when the external power voltage EVDD is equal to or larger than 1.9 volts.

As a result, the conventional semiconductor memory device may not operate normally at the external power voltage of a high level regardless of whether the control signal of the control signal setting portion is varied or not, making it difficult or impossible to relieve the abnormal semiconductor memory device.

Further, the semiconductor memory device does not operate normally since a range of the external power voltage may change, even during the normal operation of the semiconductor memory device. Thus, a conventional semiconductor memory device fails to satisfy a performance characteristic with a sufficient margin according to a specification.

SUMMARY OF THE INVENTION

It is an object of the present invention to provide a semiconductor memory device in which a characteristic according to a specification is satisfied with a sufficient margin at an external power voltage level over a wide range.

It is another object of the present invention to provide a control signal generating method of a semiconductor memory device in which a characteristic according to a specification is satisfied with a sufficient margin at an external power voltage level over a wide range.

One aspect of the present invention provides a semiconductor memory device, which may comprise: a voltage range detector configured to change a level of a voltage detecting signal responsive to whether a voltage level of a first node is between a reference voltage and a voltage level of a second node, the voltage level of the first node being resistively coupled to an external power voltage, the voltage level of the second node being resistively coupled between the reference voltage and a ground voltage; and a control signal generator configured to receive the voltage detecting signal from the voltage range detector and to generate a control signal corresponding to at least one range of a voltage level of the external power voltage, wherein the memory device is configured to perform an operation to satisfy an access time characteristic responsive to the control signal.

The control signal generating portion may comprise a control signal setting portion configured to generate a set control signal responsive to a code signal and a command signal; and a final control signal generating portion configured to output the control signal corresponding to the at least one range of the level of the external power voltage as a final control signal responsive to the voltage detecting signal and the set control signal.

The voltage range detecting portion may comprise a first comparator configured to compare the reference voltage and the voltage level of the first node to generate a first comparing signal; a second comparator configured to compare the voltage level of the first node and the voltage level of the second node to generate a second comparing signal a first voltage divider configured to divide the external power voltage to generate the voltage level of the first node; a second voltage divider configured to divide the reference voltage to generate the voltage level of the second node; and a logic gate for combining the first and second comparing signals to generate the voltage detecting signal.

The voltage range detecting portion detects whether the first voltage is between the reference voltage and the second voltage or not to transition a level of the voltage detecting signal.

Another aspect of the present invention provides a control signal generating method of a semiconductor memory device, which may comprise: a voltage range detecting step for generating a voltage detecting signal corresponding to a range of a level of an external power voltage applied from an external portion; and a control signal generating step for generating a control signal corresponding to the range of the level of the external power voltage responsive to the voltage detecting signal, wherein the semiconductor memory device performs an operation for satisfying a characteristic according to a specification responsive to the control signal.

The control signal generating step may comprise a control signal generating step for setting a control signal corresponding the range of the level of the external power voltage by using a code signal applied from the external portion responsive to a command signal applied from the external portion; and a final control signal generating step for outputting the control signal corresponding to the corresponding the range of the level of the external power voltage as a final control signal responsive to the voltage detecting signal.

The control signal setting step may comprise receiving the command signal to generate a mode setting command; storing the code signal responsive to the mode setting command; and decoding the code signal to generate the control signal.

The voltage range detecting step may comprise dividing the external power voltage to generate a first voltage and dividing a reference voltage to generate a second voltage; comprising the reference voltage and the first voltage to generate a first comparing signal and comparing the first voltage and the second voltage to generate a second comparing signal; and combining the first comparing signal and the second comparing signal to generate the voltage detecting signal.

The voltage range detecting step may comprise detecting whether the first voltage is between the reference voltage and the second voltage to transition a level of the voltage detecting signal.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Figure 1A:
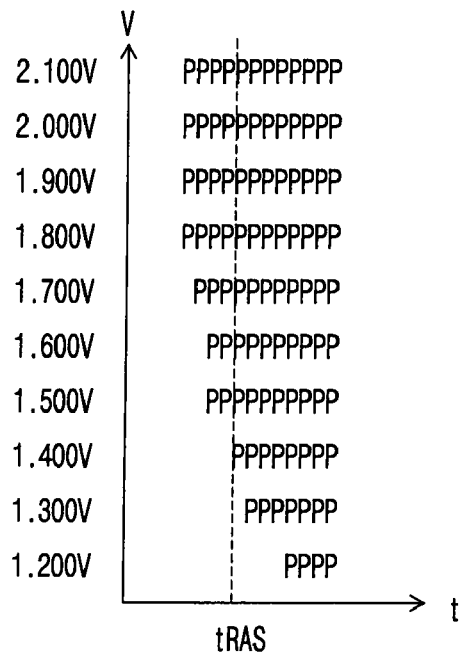
FIG. 1A is a graph illustrating evaluation of an operating margin of a conventional semiconductor memory device.
Figure 1B:
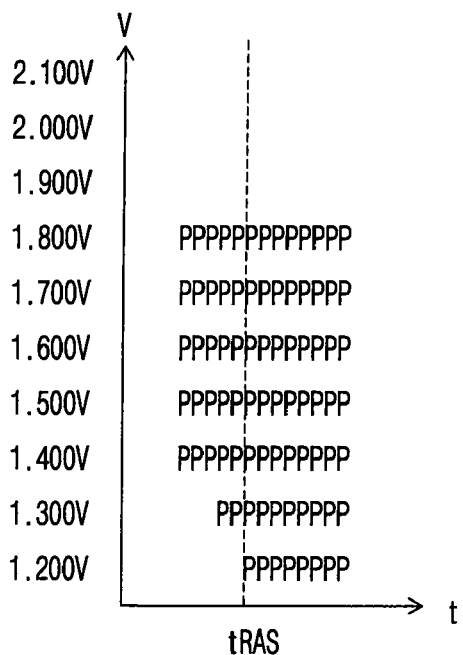
FIG. 1B is a graph illustrating evaluation of an operating margin of a conventional semiconductor memory device when a control signal set by a control signal setting portion is applied.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

Figure 2:
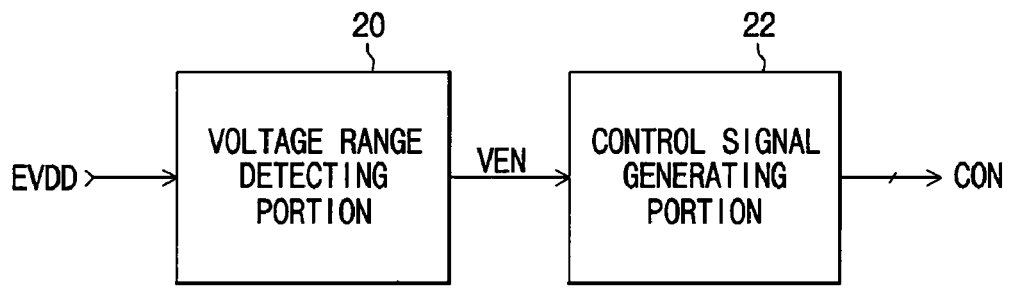
FIG. 2 is a block diagram illustrating a control signal generating circuit of a semiconductor memory device according to one exemplary embodiment of the present invention.

FIG. 2 is a block diagram illustrating a control signal generating circuit of a semiconductor memory device according to one exemplary embodiment of the present invention. The control signal generating circuit of FIG. 2 comprises a voltage range detecting portion 20 and a control signal generating portion 22.

The voltage range detecting portion 20 detects an external power voltage EVDD, which may be applied in a predefined range to generate a voltage detecting signal VEN. The control signal generating portion 22 may output a control signal, which is set responsive to the voltage detecting signal VEN as a final control signal CON. Therefore, if the external power voltage EVDD within a predefined range (deviated from a predefined range) is applied, the semiconductor memory device adjusts its operation to satisfy a characteristic according to a specification responsive to the final control signal CON. If the external power voltage EVDD deviated from a predefined range (within a predefined range) is applied, there is no need for changing a configuration or an operation of an internal circuit of the device responsive to the final control signal CON since an operation of the device meets the characteristic according to the specification.

Figure 3:
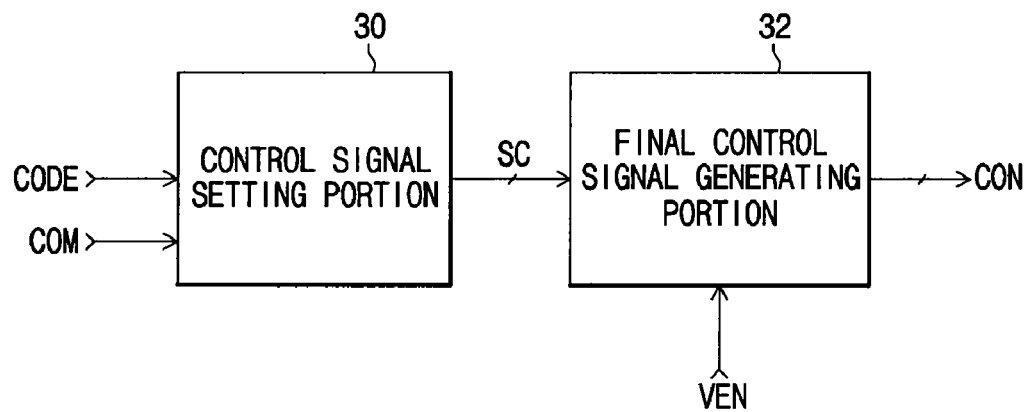
FIG. 3 is a block diagram illustrating a control signal generating portion according to one exemplary embodiment of the present invention.

FIG. 3 is a block diagram illustrating the control signal generating portion according to one exemplary embodiment of the present invention. The control signal generating portion of FIG. 3 comprises a control signal setting portion 30 and a final control signal generating portion 32.

The control signal setting portion 30 receives a code signal CODE applied from the external portion to set a control signal SC responsive to a command signal COM applied from the external portion. The final control signal generating portion 32 outputs the control signal SC as the final control signal CON or initializes the control signal SC responsive to the voltage detecting signal VEN.

Figure 4:
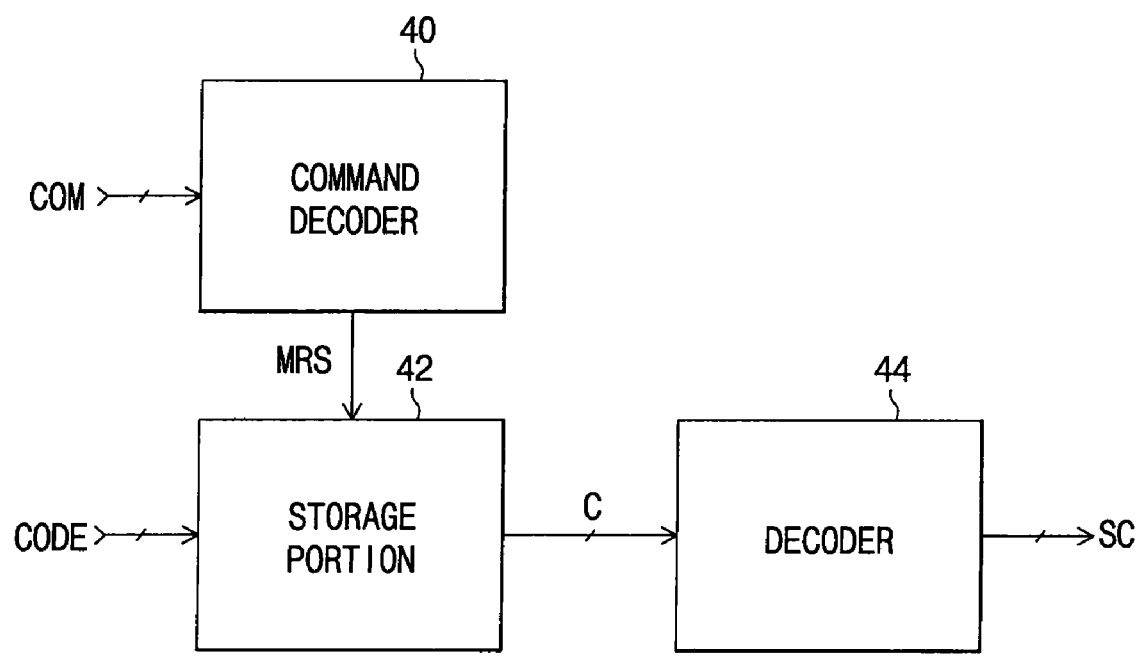
FIG. 4 is a block diagram illustrating a control signal setting portion according to one exemplary embodiment of the present invention.

FIG. 4 is a block diagram illustrating the control signal setting portion according to one exemplary embodiment of the present invention. The control signal setting portion of FIG. 4 comprises a command decoder 40, a storage portion 42, and a decoder 44.

The command decoder 40 decodes the command signal COM applied from the external portion to generate a mode setting signal MRS. The storage portion 42 stores the code signal CODE applied from the external portion and generates a signal C responsive to the mode setting signal MRS. The decoder 44 decodes the signal C to generate the control signal SC.

Figure 5:
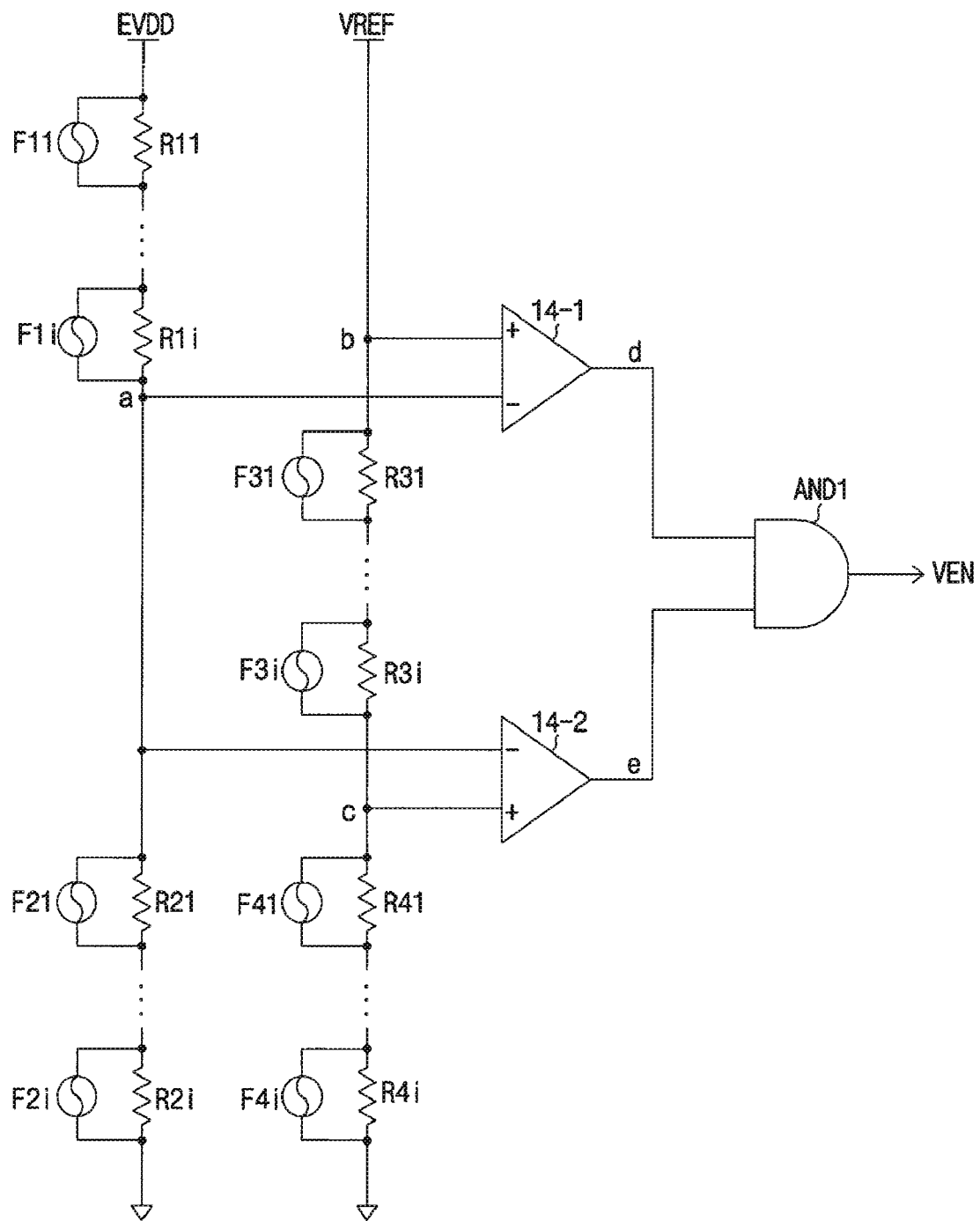
FIG. 5 is a circuit diagram illustrating a voltage range detecting portion of FIG. 2 according to one exemplary embodiment of the present invention.

FIG. 5 is a circuit diagram illustrating the voltage range detecting portion of FIG. 2 according to one exemplary embodiment of the present invention. The voltage range detecting portion may comprise resistors R11 to R1$i$, R21 to R2$i$, R31 to R3$i$, and R41 to R4$i$, fuses F11 to F1$i$, F21 to F2$i$, F31 to F3$i$, and F41 to F4$i$, comparators 14-1 to 14-2, and an AND gate AND1.

A resistance value formed by the resistors R11 to R1$i$ varies according to whether the fuses F11 to F1$i$ are blown off or not, a resistance value formed by the resistors R21 to R2$i$ varies according to whether the fuses F21 to F2$i$ are blown off or not, a resistance value formed by the resistors R31 to R3$i$ varies according to whether the fuses F31 to F3$i$ are blown off or not, and a resistance value formed by the resistors R41 to R4$i$ varies according to whether the fuses F41 to F4$i$ are blown off or not.

For sake of explanation, assume that a resistance value R1 depends on the resistors R1 to R1$i$ and the fuses F11 to F1$i$, a resistance value R2 depends on the resistors R21 to R2$i$ and the fuses F21 to F2$i$, a resistance value R3 depends on the resistors R31 to R3$i$ and the fuses F31 to F3$i$, and a resistance value R4 depends on the resistors R41 to R4$i$ and the fuses F41 to F4$i$. A divided voltage (R2/R1+R2)EVDD is generated at a node "a" and a divided voltage (R4/R3+R4)VREF is generated at a node "c." The comparator 14-1 compares a voltage of a node "b," i.e., the reference voltage VREF and a voltage (R2/R1+R2)EVDD of the node "a" and generates a signal "d" of a high level if the voltage of the node "b" is higher than the voltage of the node "a." The comparator 14-2 compares the voltage (R2/R1+R2)EVDD of the node "a" and the voltage (R4/R3+R4)VREF of the node "c" and generates a signal "e" of a high level if the voltage of the node "a" is higher than the voltage of the node "c." The AND gate AND1 generates the voltage detecting signal VEN of a high level if both the signals "d" and "e" have a high level.

Thus, the voltage range detecting portion of FIG. 5 generates the voltage detecting signal VEN of the high level if the voltage of the node "a" is lower than the voltage (reference voltage) of the node "b" and is higher than the voltage of the node "c."

In FIG. 5, the reference voltage VREF, i.e., the voltage of the node b, may be either a voltage of a stable level generated from a reference voltage generating circuit (not shown) in the device whose level does not change even though the level of the external power voltage EVDD changes, or a voltage of a stable level applied from the external portion. The voltages of the nodes "a" and "c" can be adjusted by varying the resistance values according to whether the fuses are blown off or not, so that the voltage range detecting portion can detect a predefined range of the external power voltage EVDD.

In the above described embodiment, the resistance values of the resistors can be varied by using the fuses. However, persons having skill in the art will recognize that they can be varied by replacing the fuses with switches and turning on or off the switches responsive to the control signal. The control signal may be generated by using a part of the code signal CODE applied from the storage portion of the control signal setting portion of FIG. 4.

Figure 6:
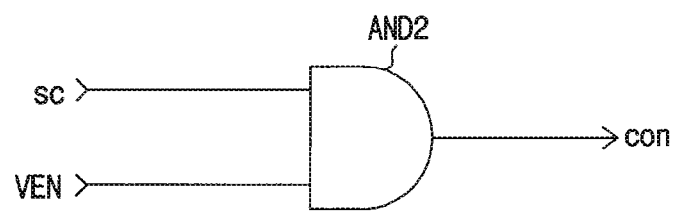
FIG. 6 is a circuit diagram illustrating a final control signal generating portion according to one exemplary embodiment of the present invention.

FIG. 6 is a circuit diagram illustrating the final control signal generating portion according to one exemplary embodiment of the present invention. The final control signal generating portion of FIG. 6 comprises an AND gate AND2.

In FIG. 6, "sc" denotes a one-bit signal of the control signal SC, and "con" denotes a one-bit signal of the final control signal CON. The AND gate AND2 generates the final control signal con of a low level regardless of the control signal SC when the voltage detecting signal VEN of a low level is generated, and generates the control signal SC as the final control signal con when the voltage detecting signal VEN of a high level is generated.

Figure 7:
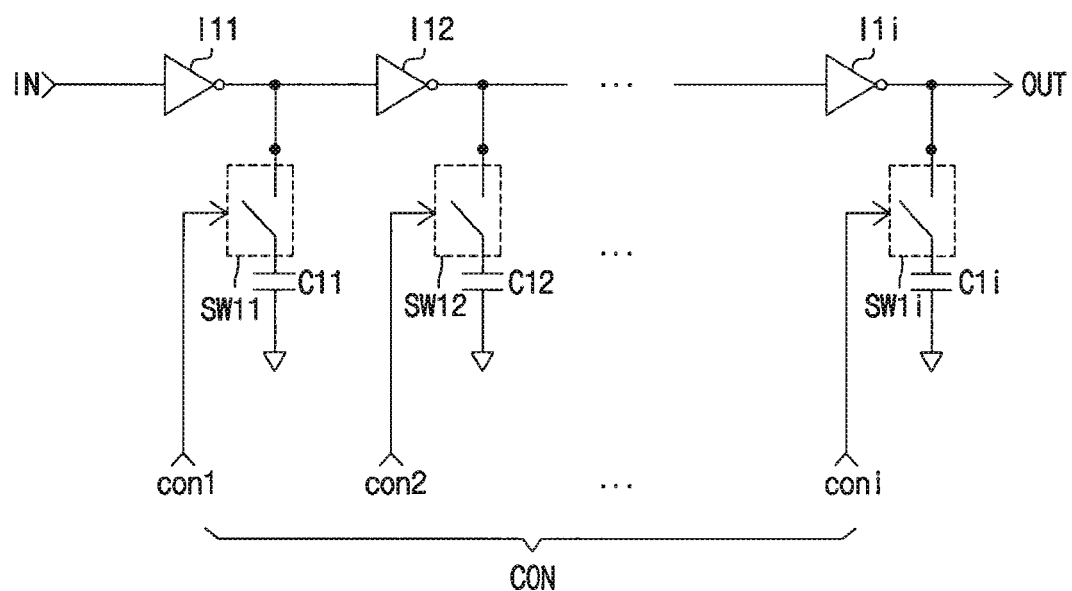
FIG. 7 is a circuit diagram illustrating a delay circuit of a semiconductor memory device according to one exemplary embodiment of the present invention.

FIG. 7 is a circuit diagram illustrating a delay circuit of a semiconductor memory device according to one exemplary embodiment of the present invention. The delay circuit of FIG. 7 comprises inverters I11 to I1$i$, capacitors C11 to C1$i$, and switches SW11 to SW1$i$.

In FIG. 7, the switches SW11 to SW1$i$ are turned on or off responsive to the final control signals con1 to con$i$, respectively. Here, let us assume that the switches SW11 to SW1$i$ are respectively turned on responsive to the final control signals con1 to con$i$ of a low level and the switches SW11 to SW1$i$ are respectively turned off responsive to the final control signals con1 to con$i$ of a high level. If all of the final control signals con1 to con$i$ have a low level, all of the switches SW11 to SW1$i$ are turned on, so that a delay time of the delay circuit has a maximum value. Conversely, if all of the final control signals con1 to con$i$ have a high level, all of the switches SW11 to SW1$i$ are turned off, so that a delay time of the delay circuit has a minimum value. In the above-described way, it is possible to adjust the delay time of the delay circuit by controlling the levels of the final control signals con1 to con$i$.

If the external power voltage of a high level is applied, the semiconductor memory device normally operates even though all of the final control signals con1 to con$i$ have a low level. But if the external power voltage of a low level is applied, since the delay time of the delay circuit of FIG. 7 is increased, the semiconductor memory device may not operate normally. In this instance, the delay time of the delay circuit of FIG. 7 is reduced by appropriately setting the final control signals con1 to coni applied to the delay circuit of FIG. 7 by using the control signal setting portion of FIG. 3, and the external power voltage range of a low level is detected by the voltage range detecting portion of FIG. 5. Therefore, the final control signal generating portion of FIG. 6 generates the final control signal con of a low level in the external power voltage range of a high level, and generates the set control signal sc as the final control signal con in the external power voltage range of a low level. Accordingly, the semiconductor memory device of the present invention can satisfy a characteristic according to a specification to thereby normally perform its operation in the external power voltage range of a low level as well as in the external power voltage range of a high level.

Figure 8:
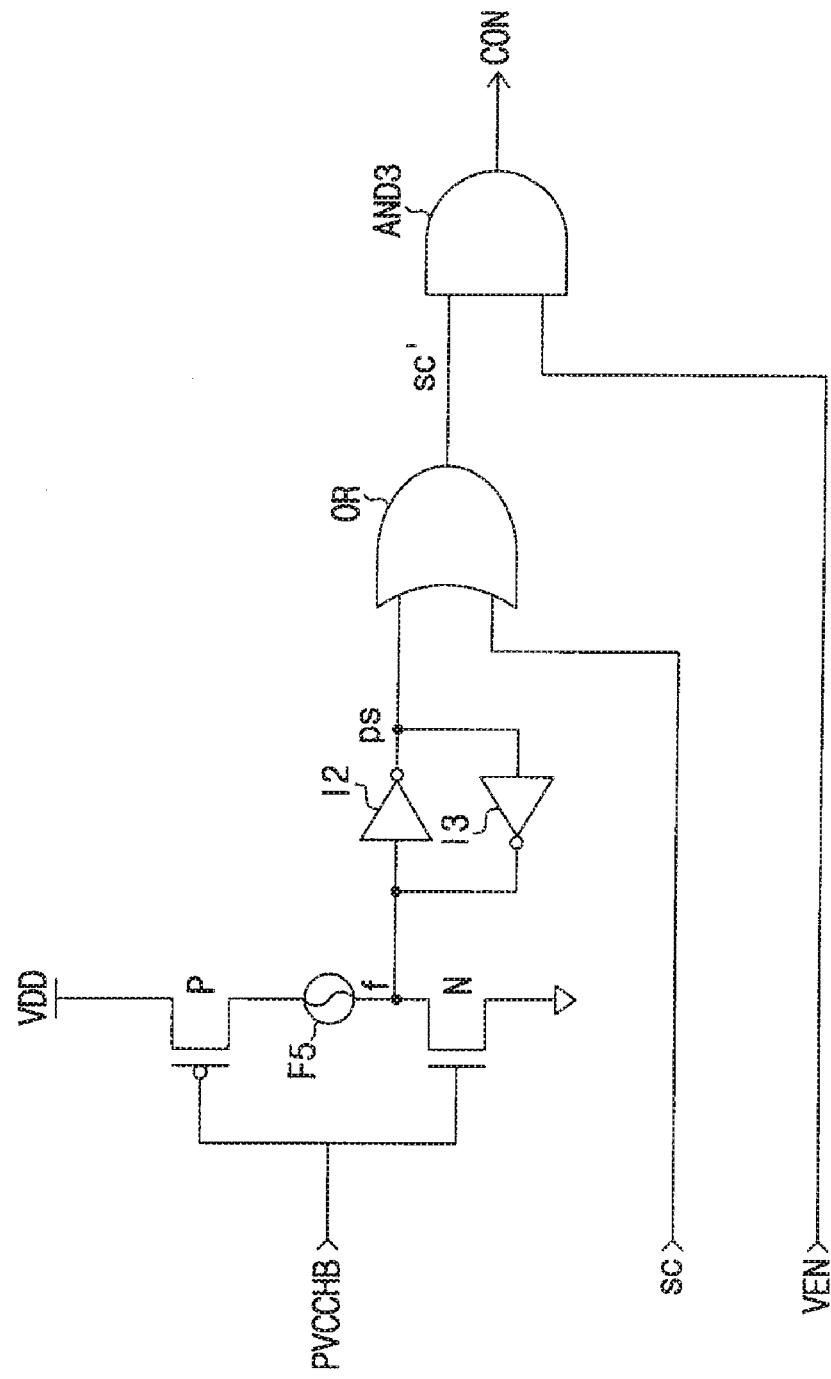
FIG. 8 is a circuit diagram illustrating a modification of the final control signal generating portion according to one exemplary embodiment of the present invention.

FIG. 8 is a circuit diagram illustrating a modification of the final control signal generating portion according to one exemplary embodiment of the present invention. The final control signal generating portion of FIG. 8 may comprise a PMOS transistor P, an NMOS transistor N, a fuse F5, a latch including inverters I2 and I3, an OR gate OR, and an AND gate AND3.

The OR gate OR generates a signal sc' of a high level when at least one signal among a set control signal sc and a programmed control signal ps has a high level and generates a signal sc' of a low level when all of the control signals sc and ps have a low level. The AND gate AND3 generates the final control signal con of a low level regardless of the signal sc' when the voltage detecting signal VEN has a low level and generates the signal sc' as the final control signal con when the voltage detecting signal VEN has a high level. A power up signal PVCCHB is a signal which maintains a low level at the initial stage when the external power voltage is applied and transitions to a high level after a predefined time. Regardless of whether the fuse F5 is blown off or not, the NMOS transistor N is turned on to make a node "f" become a low level responsive to the power up signal PVCCHB of a high level, and the inverter I2 inverts a signal of a low level to generate the programmed control signal ps of a high level. When the fuse F5 is not blown off, if the power up signal PVCCHB transitions to a low level, the PMOS transistor P is turned on to make the node "f" become a high level, and the inverter I2 inverts a signal of a high level to generate the programmed control signal ps of a low level. When the fuse F5 is blown off, even though the power up signal PVCCHB transitions to a low level, the signal of the node "f" does not change, so that the programmed control signal ps of a high level latched by the latch is generated.

In FIG. 8, "sc" denotes a one-bit signal of the control signal SC, and "con" denotes a one-bit signal of the final control signal CON. The final control signal generating portion of FIG. 8 has a fuse circuit, which may comprise the PMOS transistor P, the NMOS transistor N, the fuse F5, and the latch including the inverters I2 and I3, so that the semiconductor memory device can perform a predefined operation responsive to the programmed control signal ps by programming the fuse F5 according to the control signal sc after setting of the control signal sc is completed. For example, if the semiconductor memory device normally operates in the external power voltage range in which an abnormal operation happens when a test operation for the semiconductor memory device is performed (i.e., such that an operation of the semiconductor memory device is performed by varying the control signals SC in the external power voltage range in which an abnormal operation happens), the control signals SC of that time are programmed by fuses. Therefore, it is possible to perform a normal operation over a wide range of a level of the external power voltage even though the control signal SC is not set by performing the mode setting operation.

Figure 9:
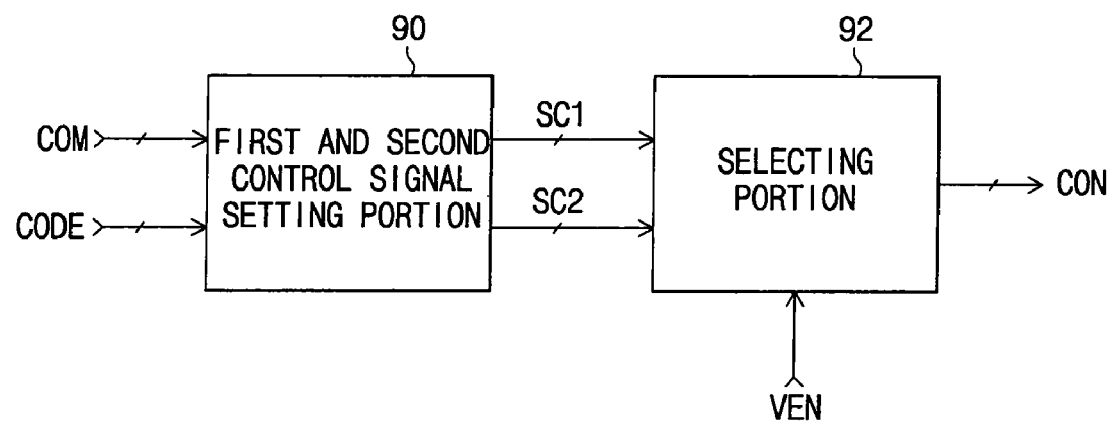
FIG. 9 is a block diagram illustrating a modification of the control signal generating portion of the semiconductor memory device of FIG. 2.

FIG. 9 is a block diagram illustrating a modification of the control signal generating portion of the semiconductor memory device of FIG. 2. The control signal generating portion of FIG. 9 may comprise first and second control signal setting portion 90 and a selecting portion 92.

The first and second control signal setting portion 90 receives the code signal CODE to set a first control signal SC1 and a second control signal SC2 responsive to the command signal COM. The selecting portion 92 selects and outputs the first control signal SC1 or the second control signal SC2 responsive to the voltage detecting signal VEN.

FIG. 9 shows a configuration of the control signal generating circuit which, can be applied in a case where the operation the semiconductor memory device by the delay circuit of FIG. 7 is not normal in both the external power voltage range of a high level and the external power voltage range of a low level. The semiconductor memory device can perform a normal operation in a wide range of the level of the external power voltage by adjusting the delay time of the delay circuit of FIG. 7 responsive to the first control signal SC1 and in the external power voltage of a low level by adjusting the delay time of the delay circuit of FIG. 7 responsive to the second control signal SC2.

Figure 10:
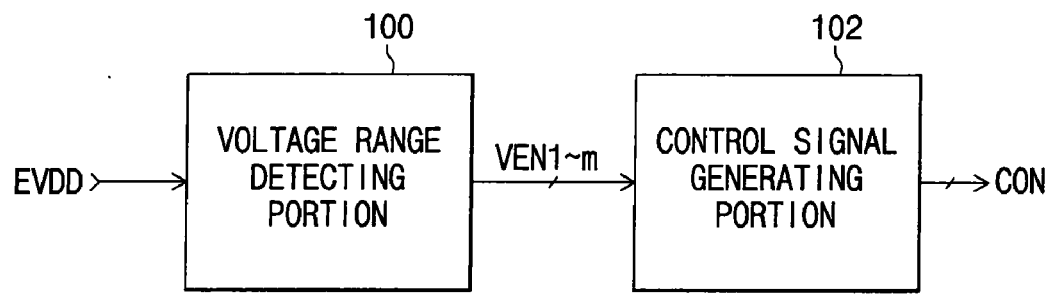
FIG. 10 is a block diagram illustrating a control signal generating circuit of a semiconductor memory device according to another exemplary embodiment of the present invention.

FIG. 10 is a block diagram illustrating a control signal generating circuit of a semiconductor memory device according to another exemplary embodiment of the present invention. The control signal generating circuit of FIG. 10 may comprise a voltage range detecting portion 100 and a control signal generating portion 102.

The voltage range detecting portion 100 detects m ranges of the external power voltage EVDD to generate m voltage detecting signals VEN1 to VENm. The control signal generating portion 102 generates the final control signal CON respectively corresponding to the m voltage detecting signals VEN1 to VENm.

Figure 11:
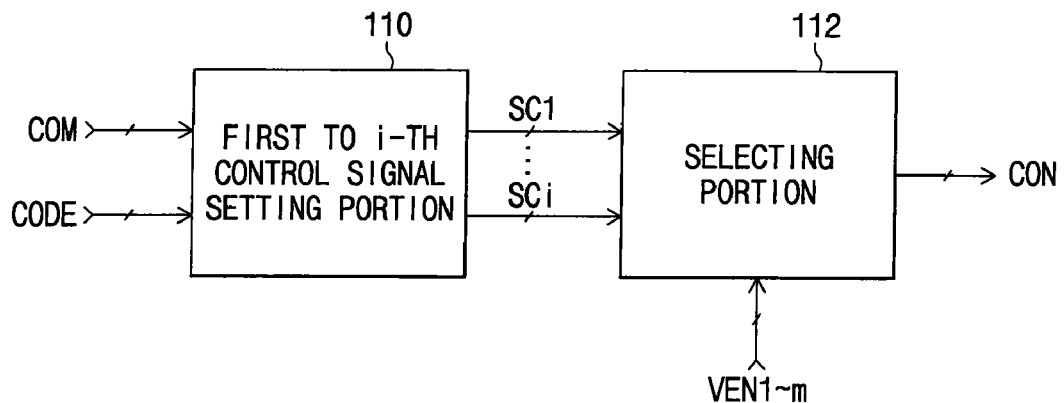
FIG. 11 is a block diagram illustrating a control signal generating portion according to another exemplary embodiment of the present invention.

FIG. 11 is a block diagram illustrating the control signal generating portion according to another exemplary embodiment of the present invention. The control signal generating portion of FIG. 11 may comprise first to i-th control signal generating portion 110 and a selecting portion 112.

The first to i-th control signal generating portion 110 may receive the code signal CODE to generate i control signals SC1 to SCi responsive to the command signal COM. The selecting portion 112 selects one of the control signals SC1 to SCi and outputs it as the final control signal CON responsive to the voltage detecting signals VEN1 to VENm.

FIGS. 10 and 11 show a configuration of the control signal generating circuit which can be applied in case where an operation of the semiconductor memory device by the delay circuit of FIG. 7 is not normal in the external power voltage range of various levels.

Figure 12:
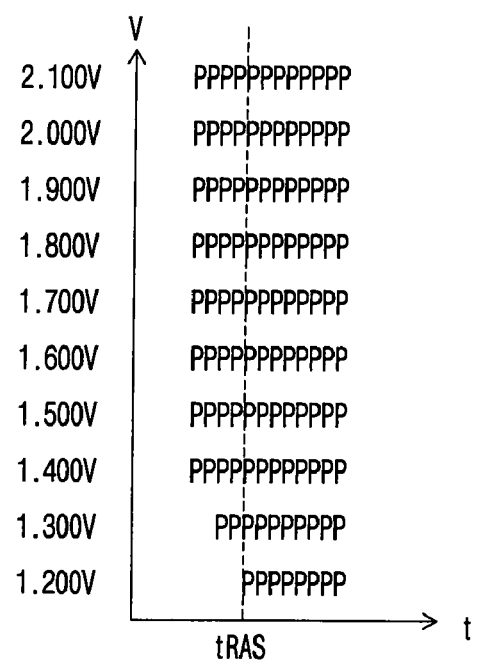
FIG. 12 is a graph illustrating evaluation of an operating margin when a final control signal set by the control signal generating circuit of the semiconductor memory device is applied according to the present invention.

FIG. 12 is a graph illustrating evaluation of an operating margin when the final control signal set by the control signal generating circuit of the semiconductor memory device is applied according to embodiments of the present invention. When the external power voltage EVDD is equal to or less than 1.8 volts and greater than 1.9 volts, the semiconductor memory device operates to satisfy the access time according to a specification with a sufficient margin. In other words, even though the level of the external power voltage EVDD changes from one range to another, the semiconductor nevertheless operates according to the specification with the sufficient margin. The measurements shown in FIG. 12 demonstrate that the semiconductor memory device satisfies the access time according to a specification over a wide range of the level of the external power voltage EVDO by applying the example configurations of FIGS. 2 to 6 to the semiconductor memory device.

In the above-described embodiment of the present invention, it has been described that the semiconductor memory device improves the access time by using the final control signal and the adjusting delay time of the internal circuit to improve the access time. Persons having skill in the art will recognize that it is possible to adjust the internal voltage as well as the delay time of the internal circuit, or to improve other characteristics according to the specification.

FIGS. 5, 6 and 8 show by way of example the AND gates and the OR gates. However, these gates may be replaced with other logic gates to generate an output of a desired level.

In some example embodiments, a control signal generating method of a semiconductor memory device may comprise: a voltage range detecting step for generating a voltage detecting signal corresponding to a range of a level of an external power voltage applied from an external portion; and a control signal generating step for generating a control signal corresponding to the range of the level of the external power voltage responsive to the voltage detecting signal, wherein the semiconductor memory device performs an operation for satisfying a characteristic according to a specification responsive to the control signal.

In some example embodiments, the control signal generating step may comprise: a control signal generating step for setting a control signal corresponding the range of the level of the external power voltage by using a code signal applied from the external portion responsive to a command signal applied from the external portion; and a final control signal generating step for outputting the control signal corresponding to the range of the level of the external power voltage as a final control signal responsive to the voltage detecting signal.

In some example embodiments, the control signal setting step may comprise: receiving the command signal to generate a mode setting command; storing the code signal responsive to the mode setting command; and decoding the code signal to generate the control signal.

In some example embodiments, the voltage range detecting step may comprise: dividing the external power voltage to generate a first voltage and dividing a reference voltage to generate a second voltage; combining the reference voltage and the first voltage to generate a first comparing signal and comparing the first voltage and the second voltage to generate a second comparing signal; and combining the first comparing signal and the second comparing signal to generate the voltage detecting signal.

In some example embodiments, the voltage range detecting step may comprise detecting whether the first voltage is between the reference voltage and the second voltage or not to transition a level of the voltage detecting signal.

As described above, the semiconductor memory device and the control signal generating method according to the present invention can perform a normal operation at the external power voltage level over a wide range since a characteristic according to a specification is improved even though the level of the external voltage changes. Therefore, it is possible to relieve an abnormal operation of the semiconductor memory device, thereby improving a manufacturing yield.

What is claimed is:

1. A semiconductor memory device, comprising:
    a voltage range detector configured to generate at least one voltage detecting signal corresponding to a range of a level of an external power voltage applied from an external portion; and
    a control signal generator configured to generate a set control signal responsive to a code signal and a command signal, and output a control signal responsive to the at least one voltage detecting signal and the set control signal receive the at least one voltage detecting signal from the voltage range detector and to generate a control signal corresponding to at least one range of a voltage level of the external power voltage,
    wherein the control signal generator comprises a control signal setting portion configured to generate a set control signal responsive to a code signal and a command signal, and a final control signal generating portion configured to output the control signal responsive to the at least one voltage detecting signal and the set control signal, and
    wherein the semiconductor memory device performs an operation for satisfying a characteristic according to a specification of the semiconductor memory device in response to the control signal.

2. The semiconductor memory device of claim 1, further comprising a delay signal generator configured to generate a delay signal responsive to the control signal, wherein the delay signal generator comprises: a plurality of serially coupled inverters of an inverter chain; at least one delay portion coupled to at least one of the serially coupled inverters; and a switch disposed between each delay portion and the at least one serially coupled inverter.

3. The semiconductor memory device of claim 1, wherein the at least one range of the voltage level of the external power voltage includes a predefined range, a logic level of the control signal having a high level responsive to the external power voltage being within the predefined range, the logic level of the control signal having a low level responsive to the external power voltage being out of the predefined range.

4. The semiconductor memory device of claim 1, wherein the control signal setting portion comprises:
    a command decoder configured to receive the command signal and to generate a mode setting command;
    a storage portion configured to store the code signal responsive to the mode setting command; and
    a decoder configured to decode the code signal to generate the set control signal.

5. The semiconductor memory device of claim 1, wherein the voltage range detector comprises:
    a first comparator configured to compare the reference voltage and the voltage level of the first node to generate a first comparing signal; and
    a second comparator configured to compare the voltage level of a first node and the voltage level of the second node to generate a second comparing signal.

6. The semiconductor memory device of claim 5, wherein the voltage range detector further comprises:
    a first voltage divider configured to divide the external power voltage to generate the voltage level of the first node; and
    a second voltage divider configured to divide the reference voltage to generate the voltage level of the second node.

7. The semiconductor memory device of claim 6, wherein the voltage range detector further comprises:
    a logic gate for combining the first and second comparing signals to generate the at least one voltage detecting signal.

8. The semiconductor memory device of claim 7, wherein the voltage range detector is configured to detect whether the voltage level of the first node is between the reference voltage and the voltage level of the second node to transition a level of the at least one voltage detecting signal.

9. The semiconductor memory device of claim 7, wherein the first voltage divider comprises:
   at least one first resistor which is serially coupled between the external power voltage and the first node; and
   at least one second resistor which is serially coupled between the first node and the ground voltage.

10. The semiconductor memory device of claim 9, wherein the second voltage divider comprises:
   at least one third resistor which is serially coupled between the reference voltage and the second node; and
   at least one fourth resistor which is serially coupled between the second node and the ground voltage.

11. The semiconductor memory device of claim 9, wherein each of the at least one first and second resistors is coupled in parallel to one of (a) a fuse and (b) a switch, thereby providing variable resistance values.

12. The semiconductor memory device of claim 10, wherein each of the at least one third and fourth resistors is coupled in parallel to one of (a) a fuse and (b) a switch, thereby providing variable resistance values.

13. The semiconductor memory device of claim 1, wherein the final control signal generating portion comprises:
   a fuse programming portion including at least one programmable fuse to generate a programmed control signal;
   a first logic gate configured to generate an intermediate control signal responsive to at least one of (a) the programmed control signal and (b) the set control signal; and
   a second logic gate configured to output the intermediate control signal as the final control signal responsive to the at least one voltage detecting signal.

* * * * *